(12) United States Patent
Guo et al.

(10) Patent No.: US 12,532,636 B2
(45) Date of Patent: Jan. 20, 2026

(54) DISPLAY PANEL AND DISPLAY DEVICE

(71) Applicant: BOE Technology Group Co., Ltd., Beijing (CN)

(72) Inventors: Zebang Guo, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 603 days.

(21) Appl. No.: 17/775,064

(22) PCT Filed: Jun. 11, 2021

(86) PCT No.: PCT/CN2021/099684
§ 371 (c)(1),
(2) Date: May 6, 2022

(87) PCT Pub. No.: WO2021/249537
PCT Pub. Date: Dec. 16, 2021

(65) Prior Publication Data
US 2022/0392970 A1 Dec. 8, 2022

(30) Foreign Application Priority Data
Jun. 12, 2020 (CN) .......................... 202010536690.8

(51) Int. Cl.
*H10K 59/65* (2023.01)
*G09G 3/32* (2016.01)
*H10K 59/18* (2023.01)
*H10K 59/60* (2023.01)

(52) U.S. Cl.
CPC ............... *H10K 59/60* (2023.02); *G09G 3/32* (2013.01); *H10K 59/18* (2023.02); *H10K 59/65* (2023.02);
(Continued)

(58) Field of Classification Search
CPC ........ H10K 59/65; H10K 59/18; H10K 59/60; H10K 59/128; H10K 59/40; G09G 3/32;
(Continued)

(56) References Cited

U.S. PATENT DOCUMENTS

| 8,222,804 B2 * | 7/2012 | Miller ................... H10K 50/85 |
| | | 313/506 |
| 10,756,136 B1 * | 8/2020 | Ma ....................... H10H 29/142 |

(Continued)

FOREIGN PATENT DOCUMENTS

| CN | 109545833 A | 3/2019 |
| CN | 109801903 A | 5/2019 |

(Continued)

OTHER PUBLICATIONS

CN202010536690.8 first office action.

Primary Examiner — Temesghen Ghebretinsae
Assistant Examiner — Karin Kiyabu
(74) Attorney, Agent, or Firm — IPro, PLLC

(57) ABSTRACT

The present application discloses a display panel and a display device, belonging to the field of display technology. The display panel comprises: a first display substrate and a second display substrate, the resolution of the second display substrate being higher than the resolution of the first display substrate; and the second display substrate has a through recess, and the orthographic projection of the first display substrate on the second display substrate covers the area where the through recess is located. The first display substrate has good light transmittance; thus, when a photosensitive sensor such as a front camera and a light sensor is located on the side of the first display substrate away from a light emission surface and a photosensitive surface of the photosensitive sensor faces the first display substrate, the photosensitive sensor can collect ambient light passing through the first display substrate, so that the photosensitive (Continued)

sensor can be normally used. In this way, it can be ensured that the display panel is an integral display panel while ensuring normal usage of a photosensitive sensor, effectively improving the integrity of the display panel.

16 Claims, 5 Drawing Sheets

(52) U.S. Cl.
CPC ............... *G09G 2300/0452* (2013.01); *G09G 2340/0407* (2013.01)

(58) Field of Classification Search
CPC .... G09G 2300/0452; G09G 2340/0407; H01L 27/156; H10H 29/142
See application file for complete search history.

(56) References Cited

U.S. PATENT DOCUMENTS

| | | | | |
|---|---|---|---|---|
| 11,839,092 | B2* | 12/2023 | Zhang | G09G 3/32 |
| 12,165,561 | B2* | 12/2024 | Li | H10K 59/121 |
| 2020/0402443 | A1* | 12/2020 | Lou | G09G 3/2003 |
| 2021/0020706 | A1 | 1/2021 | Chen | |
| 2021/0134228 | A1* | 5/2021 | Wang | G09G 3/3225 |
| 2021/0202621 | A1* | 7/2021 | Liang | H10K 59/65 |
| 2021/0281670 | A1 | 9/2021 | Wu et al. | |
| 2021/0351242 | A1* | 11/2021 | Li | H10K 59/65 |
| 2021/0356788 | A1* | 11/2021 | Zha | G02F 1/133603 |
| 2022/0013597 | A1* | 1/2022 | Liu | H10K 59/65 |
| 2022/0208949 | A1* | 6/2022 | Kang | H10K 59/38 |
| 2022/0278186 | A1* | 9/2022 | Choi | H10K 59/121 |
| 2023/0043940 | A1* | 2/2023 | Bae | H10K 59/131 |
| 2023/0045264 | A1* | 2/2023 | Wang | H10K 59/122 |

FOREIGN PATENT DOCUMENTS

| | | | | |
|---|---|---|---|---|
| CN | 110061014 A | | 7/2019 | |
| CN | 110265472 A | | 9/2019 | |
| CN | 110767681 A | | 2/2020 | |
| CN | 111653582 A | | 9/2020 | |
| CN | 115064121 A | * | 9/2022 | ........... G09G 3/3225 |
| KR | 20190050887 A | * | 5/2019 | ........... G09G 3/3275 |

* cited by examiner

DISPLAY PANEL AND DISPLAY DEVICE

CROSS-REFERENCE TO RELATED APPLICATION

This application is a US national phase application based on PCT/CN2021/099684, filed on Jun. 11, 2021, which claims priority to Chinese Patent Application No. 202010536690.8, filed on Jun. 12, 2020 and entitled "DISPLAY PANEL AND DISPLAY DEVICE," the contents of which are incorporated herein by reference in their entireties.

TECHNICAL FIELD

The present disclosure relates to the field of display technologies, and in particular, relates to a display panel and a display device.

BACKGROUND

A full-screen display device has a larger screen-to-body ratio (which generally can reach 80% or even more than 90%), such that the size of a display surface is increased without increasing an overall size of the display device.

SUMMARY

The present disclosure provides a display panel and a display device. The technical solution is as follows:

In one aspect, a display panel is provided. The display panel includes:

a first display substrate and a second display substrate, wherein a resolution of the second display substrate is higher than a resolution of the first display substrate;

wherein the second display substrate is provided with a through slot, the second display substrate is configured to be tiled with the first display substrate at the through slot, and a region of the second display substrate where the through slot is disposed is covered by the first display substrate.

In some embodiments, a shape and a size of the through slot are matched with a shape and a size of the first display substrate respectively.

In some embodiments, the first display substrate is embedded in the through slot.

In some embodiments, a side face of the first display substrate and a side face of the through slot are bonded by an optical adhesive.

In some embodiments, an overlap region is present between an edge region of the first display substrate and an edge region of the second display substrate.

In some embodiments, the overlap region is a strip-shaped region with a fixed width, and extends along a boundary of the through slot.

In some embodiments, the overlap region has a width equal to a width of one pixel in the second display substrate.

In some embodiments, the first display substrate is provided with a plurality of first pixel regions, wherein each of the first pixel region includes: a light-transmissive region and a plurality of first sub-pixel regions; and the first display substrate includes: a first light-emitting device disposed in the first sub-pixel region.

In some embodiments, the first light-emitting device is a micro light-emitting diode.

In some embodiments, the first light-emitting device is a passive matrix organic light-emitting diode.

In some embodiments, the first display substrate further includes: a first pixel drive circuit disposed in the first sub-pixel region and connected to the first light-emitting device.

In some embodiments, the second display substrate is provided with a plurality of second pixel regions, wherein each of the second pixel regions includes a plurality of second sub-pixel regions; and the second display substrate includes: a second light-emitting device disposed in the second sub-pixel region, and a second pixel drive circuit connected to the second light-emitting device.

In some embodiments, the second light-emitting device is an active matrix organic light-emitting diode.

In some embodiments, the display panel further includes: a touch substrate and a protective layer which are laminated on light-exiting surfaces of the first display substrate and the second display substrate.

In another aspect, a display device is provided. The display device includes: a power supply assembly and the display panel as described above, wherein the power supply assembly is configured to supply power to the display panel.

In some embodiments, the display device further includes: a photosensitive sensor, wherein the photosensitive sensor is disposed on a backlight side of the display panel, and an orthographic projection of a photosensitive surface of the photosensitive sensor on the display panel is within the first display substrate.

In some embodiments, the display device further includes: a first drive chip connected to the first display substrate, and a second drive chip connected to the second display substrate.

In some embodiments, the display device further includes: a general control assembly connected to the first drive chip and the second drive chip, wherein the general control assembly is configured to control, via the first drive chip and the second drive chip, the first display substrate and the second display substrate to display a same screen.

In some embodiments, the display panel is disposed between the first drive chip and the second drive chip.

In some embodiments, the power supply assembly includes: a first power supply unit and a second power supply unit, wherein the first power supply unit is connected to operating power supply terminals in the first display substrate and the second display substrate, and the second power supply unit is connected to common power supply terminals in the first display substrate and the second display substrate.

DETAILED DESCRIPTION

For clearer descriptions of the purposes, technical solutions, and advantages of the present disclosure, embodiments of the present disclosure are described in detail hereinafter with reference to the accompanying drawings.

Currently, the full-screen display device usually includes: various photosensitive sensors such as an image sensor and a light sensor in a front-facing camera. In order not to affect normal use of the photosensitive sensor, a position for placing the photosensitive sensor needs to be reserved on the front surface (i.e., the surface coplanar with the display surface) of the full-screen display device. As a result, the screen-to-body ratio of the full-screen display device is affected. Therefore, in a traditional full-screen display device, in order not to affect a screen-to-body ratio of the full-screen display device, a light-transmissive hole may be disposed in a display panel of the full-screen display device, and the region where the light-transmissive hole is disposed is ensured to be within a display region of the display panel. In this way, a photosensitive sensor is disposed on a backlight side of the display panel (that is, the side opposite to a display surface of the display panel), and a photosensitive surface of the photosensitive sensor is orientated to the light-transmissive hole. As a result, ambient light passes through the light-transmissive hole and into the photosensitive surface of the photosensitive sensor, such that the photosensitive sensor operates normally. However, in the case that the light-transmissive hole is disposed in the display panel, the display panel is not integral, causing a relatively low integrity of the display panel.

Figure 1:
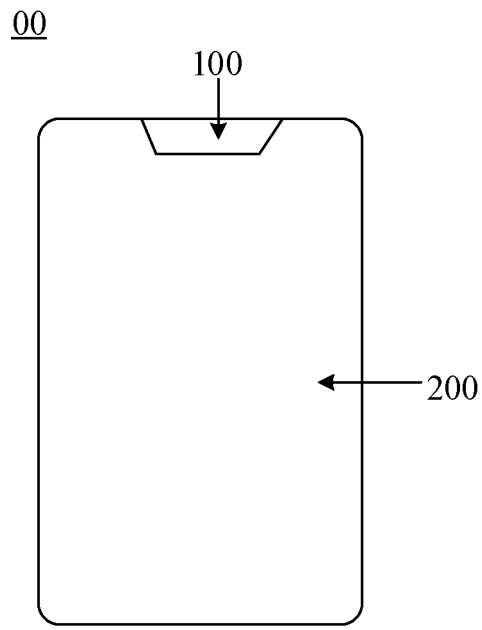
FIG. 1 is a schematic structural diagram of a display panel according to an embodiment of the present disclosure.

Referring to FIG. 1, FIG. 1 is a schematic structural diagram of a display panel according to an embodiment of the present disclosure. The display panel 00 may include: a first display substrate 100 and a second display substrate 200. A resolution of the second display substrate 200 is higher than a resolution of the first display substrate 100. That is, a number of the pixels per inch (PPI) of the second display substrate 200 is larger than a number of the PPI of the first display substrate 100. The first display substrate 100 is a low-resolution display substrate, and the second display substrate 200 is a high-resolution display substrate.

Figure 2:
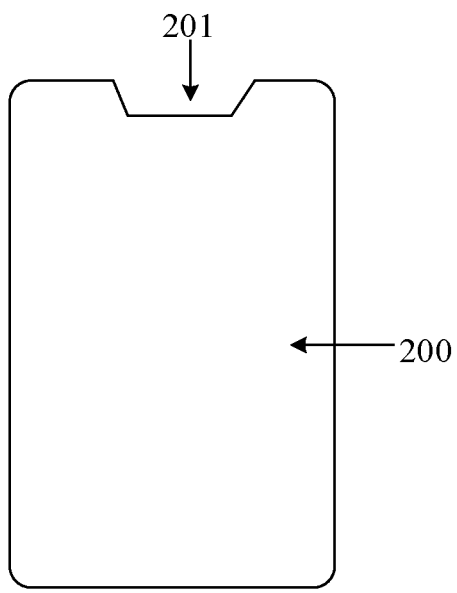
FIG. 2 is a schematic structural diagram of a second display substrate according to an embodiment of the present disclosure.

As shown in FIG. 1 and FIG. 2, FIG. 2 is a schematic structural diagram of a second display substrate according to an embodiment of the present disclosure. The second display substrate 200 is provided with a through slot 201. The second display substrate 200 is configured to be tiled with the first display substrate 100 at the through slot 201. A region of the second display substrate 200 where the through slot 201 is disposed is covered by the first display substrate 100.

In the embodiment of the present disclosure, since the resolution of the first display substrate 100 is relatively low, a light transmittance of the first display substrate 100 is better. In the case that the photosensitive sensor, such as an image sensor and a light sensor in a front-facing camera, is disposed on a backlight side of the first display substrate 100, and a photosensitive surface of the photosensitive sensor is orientated to the first display substrate 100, the photosensitive sensor may collect ambient light passing through the first display substrate 100, such that the photosensitive sensor operates normally. In this way, display panel 00 is integral on the premise of ensuring the normal operation of the photosensitive sensor by splicing the first display substrate 100 with the second display substrate 200. As a result, the integrity of the display panel 00 is effectively improved. Meanwhile, in the case that the display panel 00 is assembled into a display device, the screen-to-body ratio of the display device is increased.

In summary, the display panel according to the embodiment of the present disclosure includes: the first display substrate with a lower resolution, and the second display substrate with a higher resolution. The first display substrate has a good light transmittance, such that the normal operation of the photosensitive sensor disposed on the backlight side of the first display substrate is ensured. In this way, the display panel is integral on the premise of ensuring normal use of the photosensitive sensor by splicing the first display substrate with the second display substrate. As a result, the integrity of the display panel is effectively improved. Meanwhile, in the case that the display panel is assembled into the display device, the screen-to-body ratio of the display device is increased.

Figure 3:
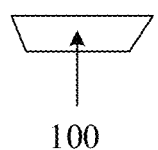
FIG. 3 is a schematic structural diagram of a first display substrate according to an embodiment of the present disclosure.

In some embodiments, as shown in FIG. 2 and FIG. 3, FIG. 3 is a schematic structural diagram of a first display substrate according to an embodiment of the present disclosure. The shape and size of the through slot 201 of the second display substrate 200 may be matched with the shape and size of the first display substrate 100. In this way, one integral display panel 00 is formed by splicing the first display panel 100 with the second display substrate 200.

It should be noted that, the shape and size of the through slot 201 in the second display substrate 200 are matched with the shape and size of the first display substrate 100 respectively, which means that the shape of the through slot 201 is similar to that of the first display substrate 100, and the size of the through slot 201 is close to that of the first display substrate 100; or, the shape of the through slot 201 is identical to that of the first display substrate 100, and the size of the through slot 201 is identical to that of the first display substrate 100. That is, the shape of the through slot 201 is identically equal to that of the first display substrate 100.

It should also be noted that FIG. 2 and FIG. 3 take as an example for schematic illustration in which both the first display substrate 100 and the through slot 201 of the second display substrate 200 are in the shape of an inverted trapezoid. In other optional implementations, both the first display substrate 100 and the through slot 201 of the second display substrate 200 are circular or waist-shaped.

In the embodiment of the present disclosure, the first display substrate 100 and the second display substrate 200 are connected by multiple connection manners. The present disclosure takes the following two optional implementations as examples for schematic illustration:

In a first optional implementation, the first display substrate 100 may be embedded in the through slot 201 of the second display substrate 200, such that the first display substrate 100 is tiled with the second display substrate 200. In this case, an edge of the first display substrate 100 is coincident with an edge of the through slot 201 of the second display substrate 200. That is, a side face of the first display substrate 100 abuts against a side face of the through slot 201 of the second display substrate 200.

In the embodiment of the present disclosure, in order to ensure the firmness of the connection between the first display substrate 100 and the second display substrate 200 in the display panel 00, the side face of the first display substrate 100 and the side face of the through slot 201 of the second display substrate 200 may be bonded by a transparent optical adhesive.

In a second optional implementation, an overlap region 500 exists between an edge region of the first display substrate 100 and an edge region of the second display substrate 200. In this case, an overlap region 500 exists between a display region of the first display substrate 100 and a display region of the second display substrate 200. In this way, a splicing gap caused by the splicing of the first display substrate 100 with the second display substrate 200 is effectively eliminated. As a result, a display effect of the display panel is effectively improved.

Figure 6:
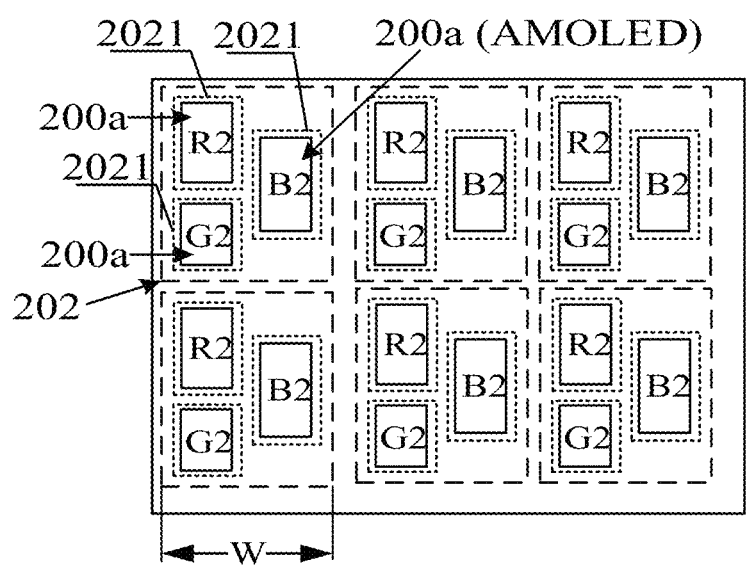
FIG. 6 is a schematic diagram of an arrangement of pixels in a second display substrate according to an embodiment of the present disclosure.
Figure 10:
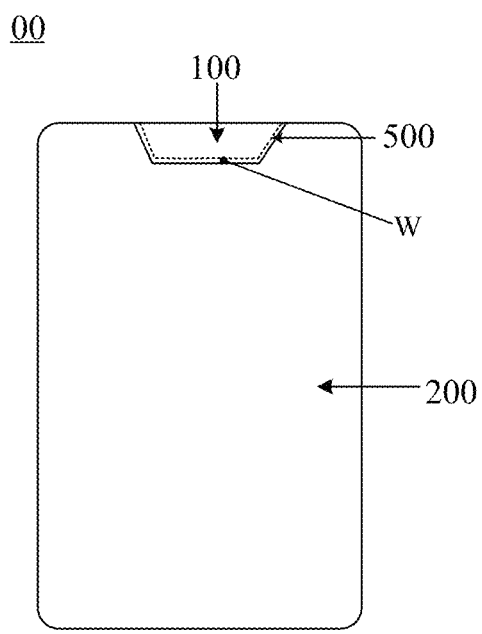
FIG. 10 is a schematic structural diagram showing an overlap region between an edge region of a first display substrate and an edge region of a second display substrate.

It should be noted that, in the case that an overlap region 500 exists between the edge region of the first display substrate 100 and the edge region of the second display substrate 200, the overlap region 500 may be in a strip-shaped and with a fixed width, and may extend along a boundary of the through slot 201. For example, the overlap region 500 may have a width W equal to the width of one pixel in the second display substrate 200 as shown in FIGS. 6 and 10. In this way, the width of the overlap region 500 is smaller, such that the influence of the overlap region 500 on the display panel 00 during display is smaller.

It should also be noted that in the case that an overlap region 500 exists between the edge region of the first display substrate 100 and the edge region of the second display substrate 200, the edge portion of one of the first display substrate 100 and the second display substrate 200 may be disposed on a light-exiting surface of the other of the first display substrate 100 and the second display substrate 200. That is, the edge portion of the first display substrate 100 may be disposed on the light-exiting surface of the second display substrate 200, or the edge portion of the second display substrate 200 may be disposed on the light-exiting surface of the first display substrate 100. Referring to FIG. 10, the dashed lines in overlap region 500 represent that an edge portion of the second display substrate 200 is covered by an edge portion of the first display substrate 100 and thus cannot be seen. The overlap region 500 not only belongs to the first display substrate 100 but also belongs to the second display substrate 200. The edge portion (see the overlap region 500) of the first display substrate 100 is on the light-exiting surface of the second display substrate 200.

In some embodiments, in the case that the display panel 00 according to the embodiment of the present disclosure is assembled into the display device, when the display device drives the display panel 00 to display screens, the display panel 00 may control a designated region of the first display substrate 100 or a designated region of the second display substrate 200 to not display the screens. The designated region of the first display substrate 100 is a region of the first display substrate 100 that is overlapped with the second display substrate 200, and the designated region in the second display substrate 200 is a region of the second display substrate 200 that is overlapped with the first display substrate 100. In this way, it can be ensured that within the overlap region 500 between the first display substrate 100 and the second display substrate 200, only one display substrate (the first display substrate 100 or the second display substrate 200) displays the screens. As a result, the display effect of the display panel 00 is further improved.

The above embodiments describe a positional relationship between the first display substrate 100 and the second display substrate 200, and the following embodiments describe structures of the first display substrate 100 and the second display substrate 200.

Figure 4:
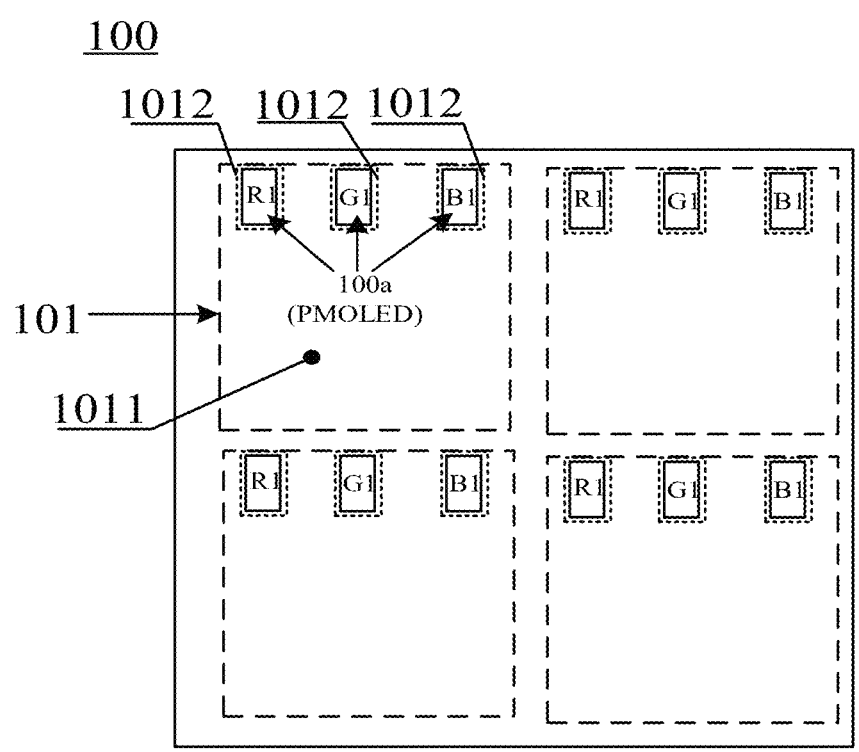
FIG. 4 is a schematic diagram of an arrangement of pixels in a first display substrate according to an embodiment of the present disclosure.

For the first display substrate 100, please refer to FIG. 4. FIG. 4 is a schematic diagram of an arrangement of pixels in a first display substrate according to an embodiment of the present disclosure. The first display substrate 100 is provided with a plurality of first pixel regions 101. Each of the first pixel regions 101 may include: a light-transmissive region 1011 and a plurality of first sub-pixel regions 1012. Exemplarily, the plurality of first sub-pixel regions 1012 in each of the first pixel regions 101 may include: a red sub-pixel region R1, a green sub-pixel region G1, and a blue sub-pixel region B1.

In the embodiment of the present disclosure, the first display substrate 100 may include: a plurality of first light-emitting devices 100a. The plurality of first light-emitting devices 100a correspond to the plurality of first sub-pixel regions 1012 of the first display substrate 100 one to one. Each of the first light-emitting devices 100a may be disposed in the corresponding first sub-pixel region 1012.

For each of the first pixel regions 101, the light-transmissive region 1011 may be filled with an insulative material with larger light transmittance, for example, the insulative material may be a transparent insulative layer material such as silicon oxide or silicon nitride. Since the first light-emitting device 100a is disposed in the first sub-pixel region 1012, the first light-emitting device 100a usually includes an opaque metal electrode. Therefore, the first sub-pixel region 1012 is opaque. In each of the first pixel regions 101, the larger the ratio of an area of the light-transmissive region 1011 to the sum of areas of the plurality of first sub-pixel regions 1012 is, the better the light transmittance of the first display substrate 100 is, which is more conducive for the subsequently mounted photosensitive sensor to collect ambient light passing through the first display substrate 100. Generally, the ratio of the area of the light-transmissive region 1011 to the sum of the areas of the plurality of first sub-pixel regions 1012 in each of the first pixel regions 101 may be designed according to requirements.

In the embodiment of the present disclosure, the first display substrate 100 may be a micro light-emitting diode (Micro LED) display substrate, and the first display substrate 100 may also be a passive matrix organic light-emitting diode (PMOLED) display substrate. Exemplarily, in the case that the first display substrate 100 is a Micro LED display substrate, the first light-emitting device 100a in the first display substrate 100 is a Micro LED; and in the case that the first display substrate 100 is a PMOLED display substrate, the first light-emitting device 100a in the first display substrate 100 is a PMOLED.

In the related art, an organic light-emitting diode (OLED) display panel with high and low resolutions is provided, and the OLED display panel is provided with a high-resolution region and a low-resolution region. In such a display substrate, for a uniform effect of the display brightness in the high-resolution region and the display brightness in the low-resolution region, a drive current of the OELD light-emitting device in the low-resolution region needs to be increased, which causes a reduced service life of the OELD device in the low-resolution region.

However, in the embodiment of the present disclosure, in the case that the first light-emitting device in the first display substrate 100 is a Micro LED or a PMOLED, the Micro LED and PMOLED have the characteristic of higher luminous brightness, and the first display substrate 100 and the second display substrate 200 may be driven by different drive chips. In this way, the display brightness of the first display substrate 100 and the second display substrate 200 achieve a uniform effect without loading a larger drive current to the first light-emitting device. As a result, the service life of the first light-emitting device is effectively improved.

In the embodiment of the present disclosure, in the case that the first light-emitting device 100a is a Micro LED, the first light-emitting device 100a may be driven to emit light in an active or a passive way. In the case that the first light-emitting device 100a is a PMOLED, the first light-emitting device 100a may be driven to emit light in a passive way.

In a first aspect, in the case that the first light-emitting device 100a needs to be passively driven, first electrodes in each row of first light-emitting devices 100a in the first display substrate 100 are connected to a same first signal line, and second electrodes of each column of first light-emitting devices 100a in the first display substrate 100 are connected to a same second signal line. In this way, in the case that a certain first light-emitting device 100a needs to be driven to emit light, corresponding driving signals may be applied to the first signal line and the second signal line that are connected to the first light-emitting device 100a, such that the first light-emitting device 100a emits light.

It should be noted that, the first electrode in the first light-emitting device 100a may be one of a cathode and an anode, and the second electrode may be the other of the cathode and the anode.

Figure 5:
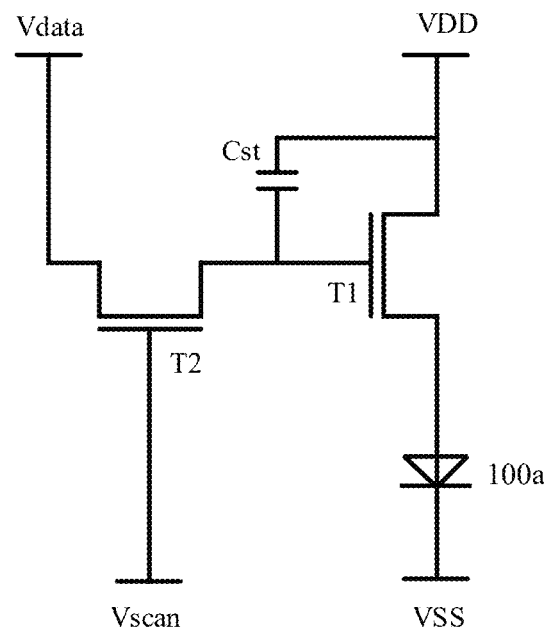
FIG. 5 is a circuit diagram of a first pixel drive circuit according to an embodiment of the present disclosure.

In a second aspect, in the case that the first light-emitting device 100a needs to be actively driven, the first display substrate 100 may further include: a first pixel drive circuit (not shown in FIG. 4) disposed in the first sub-pixel region 1012 and connected to the first light-emitting device 100a. The first pixel drive circuit may be a 2T1C drive circuit (that is, the drive circuit includes two transistors and a storage capacitor), a 7T1C drive circuit (that is, the drive circuit includes seven transistors and a storage capacitor), or an 8T1C drive circuit (that is, the drive circuit includes eight transistors and a storage capacitor). As shown in FIG. 5, the first pixel drive circuit is a 2T1C drive circuit. FIG. 5 is a circuit diagram of a first pixel drive circuit according to an embodiment of the present disclosure.

The first pixel drive circuit may include: a drive transistor T1, a switching transistor T2 and a storage capacitor Cst.

A gate of the switching transistor T2 is electrically connected to a gate scan signal line Vscan, a first electrode of the switching transistor is electrically connected to a data signal line Vdate, and a second electrode of the switching transistor T2 is electrically connected to a first terminal of the storage capacitor Cst.

A gate electrode of the drive transistor T1 is electrically connected to the first terminal of the storage capacitor Cst, a first electrode of the drive transistor T1 is electrically connected to an operating power supply terminal VDD, and a second electrode of the drive transistor T1 is electrically connected to one electrode of the first light-emitting device 100a.

The other electrode of the first light-emitting device 100a is electrically connected to a common power supply terminal VSS. A second terminal of the storage capacitor Cst is electrically connected to the operating power supply terminal VDD.

The first electrode in each of the drive transistor T1 and the switching transistor T2 may be one of a source electrode and a drain electrode, and the second electrode in each of the drive transistor T1 and the switching transistor T2 may be the other of the source electrode and the drain electrode. One electrode of the first light-emitting device 100a is generally an anode, and the other electrode of the first light-emitting device 100a is generally a cathode.

In the case that an electrical signal is input to the gate scan signal line Vscan, the switching transistor T2 is turned on. A data signal transmitted in the data signal line Vdate is input to the gate electrode of the drive transistor T1 via the switching transistor T2, and thus the drive transistor T1 is turned on. At this point, one electrode of the first light-emitting device 100a is connected to the operating power supply terminal VDD, the other electrode of the first light-emitting device 100a is connected to the common power supply terminal VSS, and thus the first light-emitting device 100a is turned on and emits light.

In the embodiment of the present disclosure, in the case that the first light-emitting device 100a in the first display substrate 100 is a Micro LED, the first display substrate 100 achieves the display requirement of high brightness on the premise of ensuring a longer service life because of the characteristics of higher brightness and longer service life of the Micro LED.

In addition, due to the higher brightness of the Micro LED, the area of the first sub-pixel region 1012 where the Micro LED is disposed can be appropriately reduced on the premise of ensuring a better display effect, thereby improving the light transmittance of the first display substrate 100.

For the second display substrate 200, please refer to FIG. 6. FIG. 6 is a schematic diagram of an arrangement of pixels in a second display substrate according to an embodiment of the present disclosure. The second display substrate 200 is provided with a plurality of second pixel regions 202, wherein each of the second pixel regions 202 may include: a plurality of second sub-pixel regions 2021. Exemplarily, the plurality of second sub-pixel regions 2021 in each of the second pixel regions 202 may include: a red sub-pixel region R2, a green sub-pixel region G2, and a blue sub-pixel region B2.

The second display substrate 200 may include: a second light-emitting device 200a disposed in each of the second sub-pixel regions 2021, and a second pixel drive circuit (not shown in FIG. 6) connected to the second light-emitting device 200a.

In some embodiments, the second light-emitting device 200a may be an OLED. The OLED needs to be electrically connected to the second pixel drive circuit, and is driven by the second pixel drive circuit to emit light. Therefore, the OLED is also commonly referred to as an active matrix organic light-emitting diode (AMOLED).

In the embodiment of the present disclosure, the second pixel drive circuit may be the same as the first pixel drive circuit. For example, the second pixel drive circuit may also be the circuit shown in FIG. 5, and the principle for the second pixel drive circuit to drive the second light-emitting device 200a to emit light may be referred to the above principle for the first pixel drive circuit to drive the first light-emitting device 100a to emit light, which is not repeated in the embodiment of the present disclosure.

Figure 7:
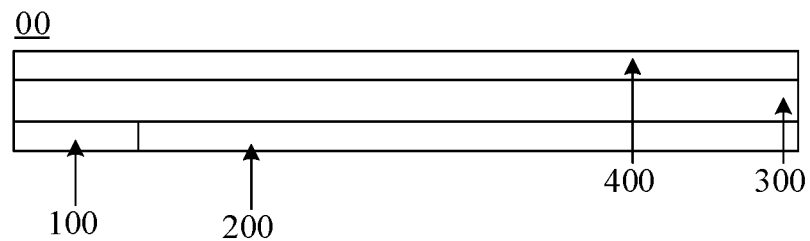
FIG. 7 is a schematic diagram of a film layer structure of another display panel according to an embodiment of the present disclosure.

In some embodiments, referring to FIG. 7, which is a schematic diagram of a film layer structure of another display panel according to an embodiment of the present disclosure, the display panel 00 may further include: a touch substrate 300 and a protective layer 400 which are laminated on the light-exiting surfaces of the first display substrate 100 and the second display substrate 200. The protective layer 400 is distal from one side of each of the first display substrate 100 and the second display substrate 200 relative to the touch substrate 300.

In summary, the display panel according to the embodiment of the present disclosure includes: the first display substrate with a lower resolution, and the second display substrate with a higher resolution. The first display substrate has a better light transmittance, such that the normal operation of the photosensitive sensor disposed on the backlight side of the first display substrate is ensured. In this way, the display panel is integral on the premise of ensuring normal use of the photosensitive sensor by splicing the first display substrate with the second display substrate. As a result, the integrity of the display panel is effectively improved. Meanwhile, in the case that the display panel is assembled into the display device, the screen-to-body ratio of the display device is increased.

An embodiment of the present disclosure further provides a method for manufacturing a display panel, and the method for manufacturing a display panel is configured to manufacture the display panel shown in FIG. 1 or FIG. 7. The method for manufacturing a display substrate is as follows:

In process A, a first display substrate is manufactured.

Exemplarily, in the case that first light-emitting devices in the first display substrate are Micro LEDs, the Micro LEDs need to be actively driven to emit light. In this case, a plurality of first pixel drive circuits for driving the first light-emitting devices to emit light may be formed on a base substrate at first. After that, a plurality of first light-emitting devices arranged in an array may be formed on another base substrate. Finally, the plurality of first light-emitting devices may be transferred onto the base substrate where the plurality of first pixel drive circuits are formed by a transfer device, and the plurality of first light-emitting devices and the plurality of first pixel drive circuits are connected in one-to-one correspondence. In this way, the first display substrate is formed.

In process B, a second display substrate is manufactured.

Exemplarily, firstly, a plurality of second pixel drive circuits may be formed on yet another base substrate. Then, a plurality of second light-emitting devices may be formed on the base substrate where the plurality of second pixel drive circuits are formed, and the plurality of second light-emitting devices and the plurality of second pixel drive circuits are connected in one-to-one correspondence. Finally, the substrate where the plurality of light-emitting devices are formed may be cut by a laser cutting device to form the second display substrate with a through slot.

In process C, the first display substrate and the second display substrate are assembled to form a display panel.

Exemplarily, the first display substrate may be assembled into the through slot in the second display substrate to form the display panel. It should be noted that, after the first display substrate and the second display substrate are assembled completely, a touch substrate and a protective layer may be sequentially formed on light-exiting surfaces of the first display substrate and the second display substrate.

Those skilled in the art can clearly understand that, for convenience and brevity of the description, an operating principle of the display panel described above may be referred to the corresponding contents in the foregoing embodiments of the structure of the display panel, which is not be repeated here.

An embodiment of the present disclosure further provides a display device. The display device may be any product or component with a display function, such as a mobile phone, a tablet computer, a television, a monitor, a notebook computer, a digital photo frame and a navigator. The display device may include: a display panel and a power supply assembly. The power supply assembly is configured to supply power to the display panel. The display panel may be the display panel shown in FIG. 1 or FIG. 7.

Figure 8:
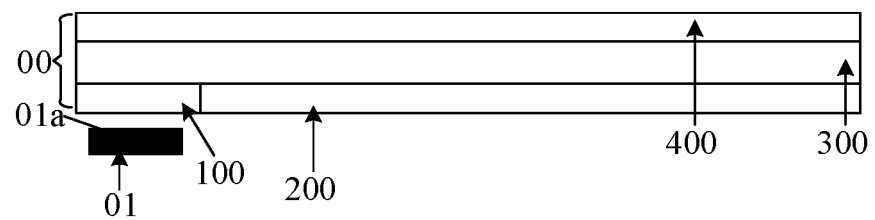
FIG. 8 is a schematic structural diagram of a display device according to an embodiment of the present disclosure.

In some embodiments, referring to FIG. 8, which is a schematic structural diagram of a display device according to an embodiment of the present disclosure, the display device may further include: a photosensitive sensor 01. The photosensitive sensor 01 may be at least one of an image sensor, a light sensor and the like in a camera (usually a front-facing camera in the display device).

The photosensitive sensor 01 may be disposed on a backlight side of the display panel 00. A photosensitive surface 01a of the photosensitive sensor 01 is orientated to the first display substrate 100 in the display panel 00, and an orthographic projection of the photosensitive surface 01a of the photosensitive sensor 01 on the display panel 00 is within the first display substrate 100. Since the resolution of the first display substrate 100 is relatively low, the light transmittance of the first display substrate 100 is better. The photosensitive sensor 01 may collect ambient light passing through the first display substrate 100, such that the photosensitive sensor 01 operates normally. For example, in the case that the photosensitive sensor 01 is the image sensor in the front-facing camera, the image sensor in the front-facing camera may collect the ambient light passing through the first display substrate 100 to perform imaging. In the case that the photosensitive sensor 01 is the light sensor, the light sensor may collect the ambient light passing through the first display substrate 100 to determine the light intensity of the ambient light.

Figure 9:
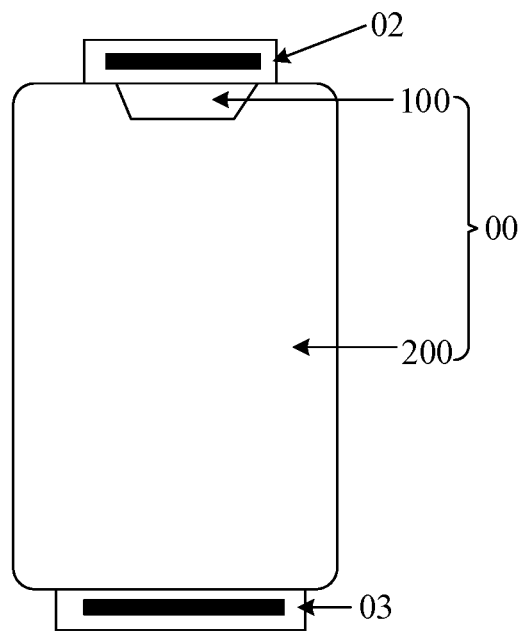
FIG. 9 is a schematic structural diagram of another display device according to an embodiment of the present disclosure.

In the embodiment of the present disclosure, referring to FIG. 9, which is a schematic structural diagram of another display device according to an embodiment of the present disclosure, the display device may further include: a first drive chip 02 connected to the first display substrate 100, and a second drive chip 03 connected to the second display substrate 200. The first display substrate 100 may be driven by the first drive chip 02 to display a screen, and the second display substrate 200 may be driven by the second drive chip 03 to display a screen. Exemplarily, the display panel 00 may be disposed between the first drive chip 02 and the second drive chip 03. For example, the first drive chip 02 is disposed on a side, away from the second display substrate 200, of the first display substrate 100, and the second drive chip 03 is disposed on a side, away from the first display substrate 100, of the second display substrate 200. In this way, the connection between the first drive chip 02 and the first display substrate 100 is ensured, without affecting the connection between the second drive chip 03 and the second display substrate 200.

In some embodiments, the power supply assembly in the display device may include: a first power supply unit and a second power supply unit. The first power supply unit may be connected to an operating power supply terminal in the first display substrate 100, and the first power supply unit may also be connected to an operating power supply terminal in the second display substrate 200. The second power supply unit may be connected to a common power supply terminal in the first display substrate 100, and the second power supply unit may also be connected to a common power supply terminal in the second display substrate 200.

In the embodiment of the present disclosure, both the first drive chip 02 and the second drive chip 03 may be connected to a general control assembly in the display device. In this way, the general control assembly may control via the first drive chip 02 and the second drive chip 03, the first display substrate 100 and the second display substrate 200 in the display panel 00 to display a same screen. It should be noted that, the first display substrate 100 may also display a screen different from that displayed by the second display substrate 200. For example, the first display substrate 100 may individually display the contents such as time information, weather information or notification information.

It should be noted that, for clarity of the illustration, the dimension of the layers and regions in the accompanying drawings may be scaled up. It may be understood that when an element or layer is described as being "on" another element or layer, the described element or layer may be directly on the other elements or layers, or an intermediate layer may be present. In addition, it may be understood that, when an element or layer is described as being "under" another element or layer, the described element or layer may be directly under the other elements or layers, or more than one intermediate layer or element may be present. In addition, it may be further understood that, when a layer or element is described as being "between" two layers or elements, the described layer or element may be the only layer between the two layers or elements, or more than one intermediate layer or element may be present. Like reference numerals denote like elements in the whole description.

In the present disclosure, the terms "first" and "second" are merely used for describing, should not be constructed to indicate or imply any relative importance. The term "a plurality of" refers to two or more, unless specifically defined otherwise.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising: a first display substrate and a second display substrate; wherein
   a resolution of the second display substrate is higher than a resolution of the first display substrate; and
   the second display substrate is provided with a through slot, the second display substrate is configured to be tiled with the first display substrate at the through slot, and a region of the second display substrate where the through slot is disposed is covered by the first display substrate; and
   wherein a shape and a size of the through slot are matched with a shape and a size of the first display substrate respectively;
   wherein an overlap region is present between an edge region of the first display substrate and an edge region of the second display substrate; and
   wherein an edge portion of the first display substrate is disposed on a light-exiting surface of the second display substrate.

2. The display panel according to claim 1, wherein the first display substrate is embedded in the through slot.

3. The display panel according to claim 2, wherein a side face of the first display substrate and a side face of the through slot are bonded by an optical adhesive.

4. The display panel according to claim 1, wherein the overlap region is a strip-shaped region with a fixed width and extends along a boundary of the through slot.

5. The display panel according to claim 4, wherein the overlap region has a width equal to a width of one pixel in the second display substrate.

6. The display panel according to claim 1, wherein the first display substrate is provided with a plurality of first pixel regions, each of the first pixel regions comprising a light-transmissive region and a plurality of first sub-pixel regions; and
   the first display substrate comprises: a first light-emitting device disposed in one of the plurality of first sub-pixel regions.

7. The display panel according to claim 6, wherein the first light-emitting device is a micro light-emitting diode.

8. The display panel according to claim 6, wherein the first light-emitting device is a passive matrix organic light-emitting diode.

9. The display panel according to claim 6, wherein the first display substrate further comprises: a first pixel drive circuit disposed in the one of the plurality of first sub-pixel regions and connected to the first light-emitting device.

10. The display panel according to claim 1, wherein the second display substrate is provided with a plurality of second pixel regions, each of the second pixel regions comprising a plurality of second sub-pixel regions; and
    the second display substrate comprises: a second light-emitting device disposed in one of the plurality of second sub-pixel regions, and a second pixel drive circuit connected to the second light-emitting device.

11. The display panel according to claim 10, wherein the second light-emitting device is an active matrix organic light-emitting diode.

12. The display panel according to claim 1, further comprising: a touch substrate and a protective layer which are laminated on a light-exiting surface of the first display substrate and the light-exiting surface of the second display substrate.

13. A display device, comprising: a display panel, wherein the display panel comprises a first display substrate and a second display substrate; wherein
    a resolution of the second display substrate is higher than a resolution of the first display substrate; and
    the second display substrate is provided with a through slot, the second display substrate is configured to be tiled with the first display substrate at the through slot, and a region of the second display substrate where the through slot is disposed is covered by the first display substrate; and
    wherein a shape and a size of the through slot are matched with a shape and a size of the first display substrate respectively;
    wherein an overlap region is present between an edge region of the first display substrate and an edge region of the second display substrate; and
    wherein an edge portion of the first display substrate is disposed on a light-exiting surface of the second display substrate.

14. The display device according to claim 13, further comprising: a photosensitive sensor, wherein the photosensitive sensor is disposed on a backlight side of the display panel, and an orthographic projection of a photosensitive surface of the photosensitive sensor on the display panel is within the first display substrate.

15. The display device according to claim 14, further comprising: a first drive chip connected to the first display substrate, and a second drive chip connected to the second display substrate.

16. The display device according to claim 15, wherein the display panel is disposed between the first drive chip and the second drive chip.

* * * * *